United States Patent
Beele

(10) Patent No.: US 6,674,012 B2
(45) Date of Patent: Jan. 6, 2004

(54) ELECTRICALLY CONDUCTIVE FORMING PASTE

(75) Inventor: Johannes Alfred Beele, Aalten (NL)

(73) Assignee: Beele Engineering B.V., Aalten (NL)

(*) Notice: Subject to any disclaimer, the term of this patent is extended or adjusted under 35 U.S.C. 154(b) by 25 days.

(21) Appl. No.: 09/964,974

(22) Filed: Sep. 27, 2001

(65) Prior Publication Data

US 2002/0145133 A1 Oct. 10, 2002

Related U.S. Application Data

(63) Continuation of application No. PCT/NL00/00203, filed on Mar. 27, 2000.

(30) Foreign Application Priority Data

Apr. 1, 1999 (NL) .............................................. 1011718

(51) Int. Cl.$^7$ .............................. H01B 1/20; H01B 7/00
(52) U.S. Cl. ................... 174/140 R; 252/511; 252/512; 174/152 R; 174/212
(58) Field of Search ................................ 252/511, 512; 250/519.1; 174/110 R, 140 R, 152 R, 212

(56) References Cited

U.S. PATENT DOCUMENTS

| | | | |
|---|---|---|---|
| 4,545,914 A | 10/1985 | Graiver et al. | |
| 4,734,541 A | 3/1988 | Moran, Jr. | |
| 5,288,429 A | 2/1994 | von Bonin et al. | |
| 6,096,413 A | * | 8/2000 | Kalinoski et al. ............ 428/220 |

FOREIGN PATENT DOCUMENTS

| | | |
|---|---|---|
| JP | 9047751 | 3/1997 |
| NL | 1008522 | 3/1998 |
| WO | WO9322774 | 11/1993 |

* cited by examiner

*Primary Examiner*—Mark Kopec
(74) *Attorney, Agent, or Firm*—Jones Day

(57) ABSTRACT

A forming paste, for example in the form of a sprayable putty, wherein the composition substantially consists of a binder and an electrically conductive component in such an amount that a signal attenuation of at least −30 dB or higher takes place in the range of 30 MHz–1 Ghz in the electromagnetic interference measurement according to the EMC IEC 11.9.1 standard.

14 Claims, 1 Drawing Sheet

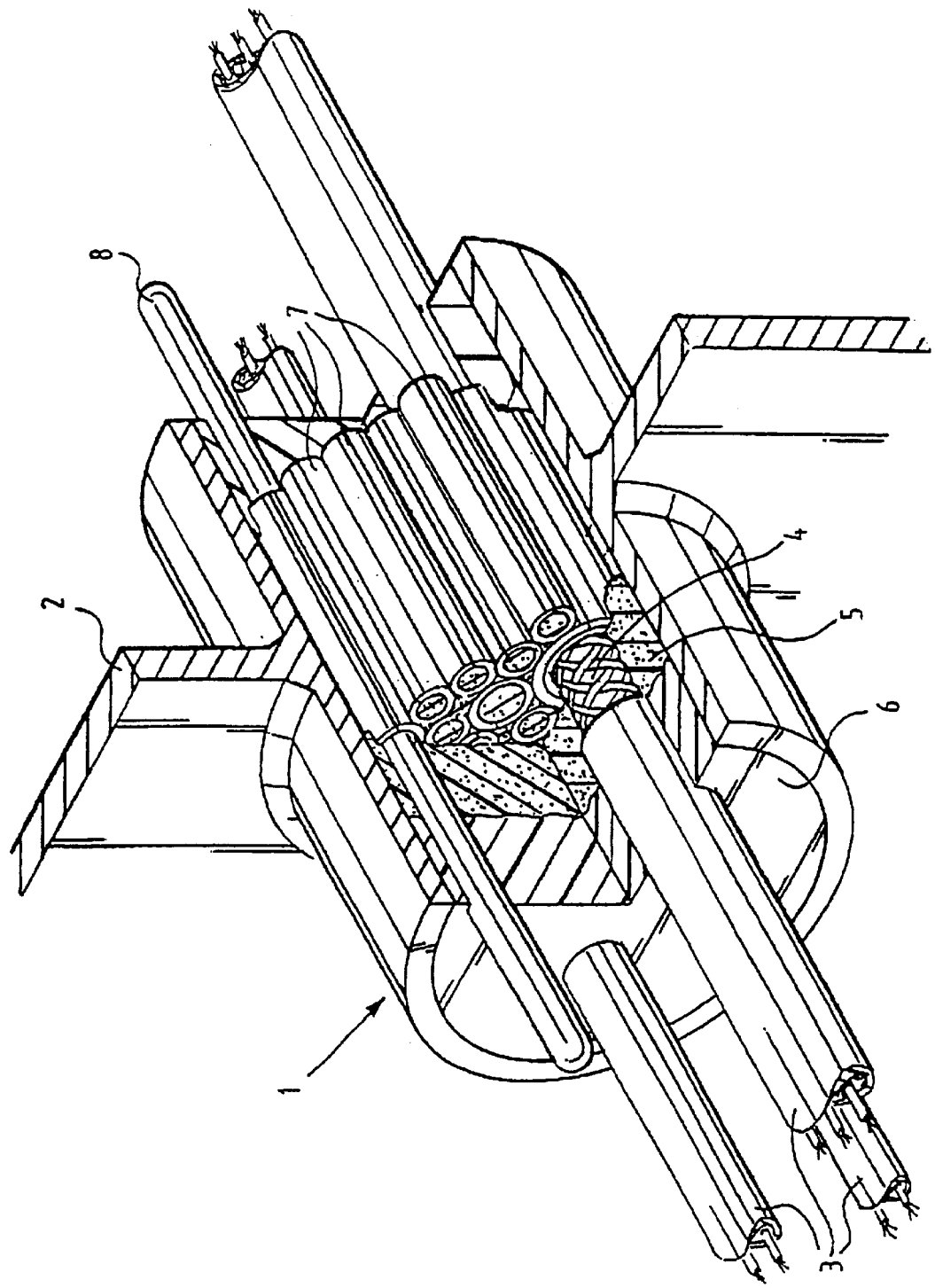

ELECTRICALLY CONDUCTIVE FORMING PASTE

PRIORITY CLAIM

This application is a Continuation of International Application No. PCT/NL00/00203, filed Mar. 27, 2000, which claims the benefit of Netherlands patent application No. 1011718, filed Apr. 1, 1999.

BACKGROUND OF THE INVENTION

1. Field of the Invention

The invention relates to a forming paste, for example in the form of a sprayable putty, wherein the composition substantially consists of a binder and an electrically conductive component.

2. Description of the Related Art

Such forming pastes are well-known. U.S. Pat. No. 4,279,783 relates to electrically conductive silicone elastomers wherein the addition of a small amount of carbon fibres enhances the electrical conductivity. The problem of these prior art forming pastes is the (relatively) high electrical resistance value thereof. Other conductive fillers can be added to the forming paste so as to reduce said resistance value. This is not desirable, however, as it causes the viscosity to increase to such an extent that such a forming paste is no longer suitably workable for a great many purposes.

It is an object of the invention to provide a forming paste, preferably in sprayable form, which forming paste is suitable for filling a space within a steel housing containing cables for the purpose of electrically connecting said cables to the housing as protection against electromagnetic overtension and/or interference.

Thus the forming paste will form a bushing device to protect against electromagnetic overtension and/or interference.

Another object of the invention is to provide a fire-resistant, electrically conductive paste which is chemically resistant and which can easily be used, in particular as a bushing device for any type of cable diameter and a non-predetermined number of cables.

SUMMARY OF THE INVENTION

To this end the invention provides a forming paste which is composed so that a signal attenuation of at least −30 dB or higher takes place in the range of 30 MHz–1 Ghz in the electromagnetic interference measurement according to the EMC IEC 11.9.1 standard.

In order to accomplish the above objectives, the invention furthermore provides a forming paste wherein the binder is selected from the group of elastomers, preferably silicones, and wherein the electrically conductive material is carbon-based, preferably expandable graphite, since this form of graphite also exhibits fire-resistance. Said binder and said form of carbon are advantageous with a view to achieving a low resistance value and a good viscosity. More preferably, oil and/or other agents, such as anti-static agents and viscosity-reducing agents, are added, as a result of which in particular a good workability is obtained.

Surprisingly, the invention provides a forming paste which has a suitable viscosity, as a result of which it is capable of being sprayed, thus enabling a wide range of applications, and which has a surprisingly low resistance value.

The forming paste according to one preferred embodiment of the invention will be marketed under the name of CONDUCTON©, which is a brand name of Beele Engineering B.V. Said CONDUCTON© forming paste has additional properties:

specific weight 1.4±0.03 g/cm³ tensile strength 0.8 Mpa elongation at break 40% hardness 30 Shore A elasticity approx. 25% and in addition it adheres well to metal surfaces, such as steel, zinc and copper. The resistance of CONDUCTON© forming paste is less than 100 ohms and in addition it is water repellent.

One preferred use is the use of the forming paste as a bushing device for at least one cable to provide protection against electromagnetic overtension and or interference.

A bushing device in the form of an non-deformable plug provided with holes is disclosed in the present applicant's Dutch patent application N1-1008522. Said plugs are limited in use both by the number of bores and by the diameter thereof, which bores are formed in advance, so that the plug cannot be adapted any more once it has been manufactured. The object of the invention is to provide a bushing device which exhibits a high degree of adaptability. This object is accomplished by using the forming paste according to the invention as a bushing device.

Electrical installations and machines, wherein generally highly sensitive components are used for control and registration purposes, are easily subject to interference by various external electromagnetic fields and pulses. Said external electromagnetic fields and pulses cause a great deal of malfunctions, which are undesirable, and they are usually enclosed via steel constructions, which function as a Faraday cage. Electrical cables, which are led in and out of such a shielded space, can conduct undesirable electromagnetic fields and pulses into the electronic equipment as yet, however. Said conduction will generally take place over an electrically conductive shield (braiding) of the respective cables that are led through. Because of this, the cable is partially stripped of its insulation sheath and is earthed via the forming paste according to the invention and its housing. The prior art bushing plug is pre-formed, however, so that the diameter of the cables and of the bushing channel as well as the number of cables need to be determined in advance.

The use of the present forming paste as a bushing device provides an adaptable mass, so that neither the dimension of a bushing channel nor the number of cables need to be known in advance.

Preferred embodiments of the composition of a forming paste according to the invention are shown below on a weight basis.

Possible trade names of the products that are used are:

| | |
|---|---|
| Silicone putty | Rhone Poulenc CAF22 |
| Silicone oil | Rhodosil 47/V100 |
| Expandable graphite | Callotek 500 CB 140E |
| | Kynol 0185 |
| | Anjay metachem S-15 L120 |
| Antistatic agent | Kenstat KS MZ 100 |
| | Kenstat KS N100 |
| Viscosity-reducing agent | Ken-react KR TTS |
| | Ken-react KR 46B |

-continued

| An example of a formula is (% by weight): | | |
|---|---|---|
| Rhone Poulenc CAF 22 | 100 | (75–100) |
| Rhodorsil 47/V100 | 75 | (50–100) |
| Kenstat KS N100 | 4 | (2–4) |
| Callotec 500 CB 140E | 175 | (150–200) |

Experiment

The electrical conductivity of a forming paste according to the invention was measured by experiment. The electrical resistance was less than 1,000 ohms at all times, and preferably less than 100 ohms. The resistance values are determined via ISO 2878 standard methods in all cases.

A sample plate dimensioned 100×100×10 mm was used for determining the resistance value. Square electrodes dimensioned 25×25 mm, which were spaced 50 mm apart, were applied to the surface of the test piece by means of Aquadag (a colloidal suspension of carbon in water). Resistance values of 80–90 ohms and even lower were recorded.

The invention, in one special embodiment thereof, relates to the use of the electrically conductive forming paste in a multi-cable bushing, which use will be understood more clearly when studied in conjunction with the appended drawings.

BRIEF DESCRIPTION OF THE DRAWING

FIG. 1 illustrates a perspective view, partially broken away showing an electrical connector employing the principles of the invention.

DETAILED DESCRIPTION

In the drawing, a bushing channel 1 in a housing 2 contains a number of (possibly multi-conductor) cable 3. Said cables 3 are stripped of their sheath along a suitable portion of their length so as to place them into electrically conductive contact with their surroundings. Said portion 4 of the length of cable 3 will then be embedded with the conductive forming paste 5 so as to provide conduction between cables 3 and housing 1. Subsequently, a suitable sealing putty 6 is provided. In addition, cables 3 may be provided with so-called RISE© (brand name of Beele Engineering B.V.) hose portions 7, which are divided lengthways, so that they can be fitted after said cables 3 have been pulled through the bushing 1. Filling hoses are used to fill the remaining space in bushing 1. Possibly, a so-called blind section 8 can be fitted in bushing 1 in order to be used for positioning empty hose portions in bushing 1. Said blind sections 8 can be simply removed when cables 3 are fitted in their place. Said blind sections 8 are electrically conductive and they may be provided with a marking colour.

The bushing 1 which is shown in the drawing provides a high-quality, fire-resistant, gas and watertight bushing device, which is also protected against electromagnetic overtension and/or interference.

It stands to reason that the variations of the use described herein are possible, but the final positioning of the forming paste 5 is advantageous as regards use and accessibility.

What is claimed is:

1. Bushing device (1) for at least one cable (3) to provide protection against electromagnetic overtension and/or interference, said busing device (1) having a housing (2) in which the cable (3) is led through, said cable (3) being partially stripped of its insulation sheath along a portion (4) of its length, wherein said portion (4) is embedded with an electrically conductive forming paste (5) so as to place said cable (3) into electrically conductive contact via the forming paste (5) with the housing (2), wherein the composition of the forming paste (5) comprises a binder and an electrically conductive component in such an amount that a signal attenuation of at least −30 dB or higher takes place in the range of 30 MHz–1 Ghz in the electromagnetic interference measurement according to the EMC IEC 11.9.1 standard.

2. Bushing device (1) according to claim 1, wherein said attenuation of the signal exceeds −60 dB.

3. Bushing device (1) according to claim 1, wherein said forming paste (5) has a resistance of less than 1,000 ohms.

4. Bushing device (1) according to claim 1, wherein the forming paste (5) has a resistance of less than 100 ohms.

5. Bushing device (1) according to claim 1, wherein said binder has been selected from the group of elastomers and wherein said electrically conductive material is carbon-based.

6. Bushing device (1) according to claim 1, wherein said binder is a silicone rubber and wherein said electrically conductive material is graphite.

7. Bushing device (1) according to claim 6, wherein said electrically conductive material forms 40–60% by weight of the entire composition.

8. Bushing device (1) according to claim 1, wherein furthermore a plasticizer has been added to the composition of the forming paste (5).

9. Bushing device (1) according to claim 1, wherein an anti-static agent has been added to the forming paste (5).

10. Bushing device (1) according to claim 1, wherein a viscosity-reducing agent has been added to the forming paste (5).

11. Bushing device (1) according to claim 6, wherein said silicone rubber and said conductive material are present in equal quantities by weight in the forming paste (5).

12. Bushing device (1) according to claim 1, wherein the composition of the forming paste (5) is as follows (in percent by weight):

silicones+silicone oil 40–60% by weight graphite 60–40% by weight anti-static agents 0–3% by weight viscosity-reducing agents 0–3% by weight.

13. Bushing device (1) according to claim 1, wherein the forming paste (5) has a viscosity which makes it possible to inject said forming paste (5).

14. Method for protecting at least one cable (3) led through a housing (2) of a bushing device (1) against electromagnetic overtension and/or interference, comprising the steps of:

partially stripping said cable (3) of its insulation sheath along a portion (4) of its length;

embedding said portion (4) with an electrically conductive forming paste (5) so as to place said cable (3) into electrically conductive contact via the forming paste (5) with the housing (2), wherein the forming paste (5) comprises a binder and an electrically conductive component in such an amount that a signal attenuation of at least −30 dB or higher takes place in the range of 30 MHz–1 Ghz in the electromagnetic interference measurement according to the EMC IEC 11.9.1 standard.

* * * * *